United States Patent
Jeon

(10) Patent No.: US 6,952,370 B2
(45) Date of Patent: Oct. 4, 2005

(54) DATA OUTPUT BUFFER CAPABLE OF CONTROLLING DATA VALID WINDOW IN SEMICONDUCTOR MEMORY DEVICES

(75) Inventor: Young-Jin Jeon, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 16 days.

(21) Appl. No.: 10/749,428

(22) Filed: Dec. 31, 2003

(65) Prior Publication Data

US 2004/0189352 A1 Sep. 30, 2004

(30) Foreign Application Priority Data

Mar. 20, 2003 (KR) .................................. 10-2003-0017568

(51) Int. Cl.$^7$ ............................................... G11C 16/04
(52) U.S. Cl. ................... 365/189.05; 365/194; 365/233
(58) Field of Search ........................... 365/189.05, 194, 365/233, 230.08

(56) References Cited

U.S. PATENT DOCUMENTS

| 5,526,506 A | 6/1996 | Hyatt |
| 5,602,999 A | 2/1997 | Hyatt |
| 5,708,609 A | 1/1998 | Hoang |
| 5,895,960 A | 4/1999 | Fritz et al. |
| 6,034,916 A | 3/2000 | Lee |
| 6,643,215 B2 * | 11/2003 | Kwak .................... 365/233 |

FOREIGN PATENT DOCUMENTS

| JP | 05-144944 | 6/1993 |
| JP | 11-250666 | 9/1999 |
| KR | 1020040074901 | 8/2004 |

* cited by examiner

*Primary Examiner*—David Lam
(74) *Attorney, Agent, or Firm*—Blakely Sokoloff Taylor & Zafman

(57) ABSTRACT

The primary objective of the present invention is to provide a data output buffer capable of preventing the phenomenon of a wide data valid window caused from early outputting of the first output data during data output operations. For this purpose, the present invention provides a data output buffer circuit in a semiconductor memory device which includes: a driving part for receiving pull-up and pull-down control signals and driving a data output terminal with a voltage level corresponding to data read from a memory cell; and a controlling part for supplying the driving part with control signals to delay the first output of the read data for a designated delay time, and to cause the output of the driving part to retain high impedance state during the designated delay time.

20 Claims, 5 Drawing Sheets

DATA OUTPUT BUFFER CAPABLE OF CONTROLLING DATA VALID WINDOW IN SEMICONDUCTOR MEMORY DEVICES

FIELD OF THE INVENTION

The present invention relates to a data output buffer in semiconductor memory devices, and more particularly to a data output buffer capable of adjusting the data valid window in semiconductor memory devices.

BACKGROUND OF THE INVENTION

Various loads including output pads, off-chip loads, and measuring apparatuses, reaching about 50 pF in sum, are externally connected with a chip. So, a specially designed buffer, also called as output driver, instead of a conventional buffer is needed in order to drive these high loads.

FIG. 1 is a circuit diagram showing a data output buffer circuit according to the related art. FIG. 2 is a timing diagram which shows the data output pulses upon a Read command in a double data rate (DDR) synchronous dynamic random access memory (SDRAM) employing the output buffer of FIG. 1.

Referring to FIG. 1, the data output buffer circuit according to the related art includes: a latch 10 for holding 'NETUP1' and 'NETDN1', which are output data of data control circuits within a chip; a data out driver 30 for outputting amplified data; and a data out pre-driver 20 for driving the data out driver 30.

On the other hand, the 'NETUP1' and 'NETDN1' signals mentioned above can be viewed as pull-up and pull-down control signals respectively. 'NETUP1' and 'NETUP2' each other have different logic values owing to the inverter INV. 'NETDN1' and 'NETDN2' have the same logic values.

From now on, the behavior of the output buffer circuit having the structure mentioned above is explained with reference to FIG. 2.

As shown in FIG. 2, when a DRAM Read command is given with reference to an external clock input CLK, data are outputted through the data output buffer circuit after the CAS latency.

While the data are not outputted, the 'NETUP2' node maintains 'logic high' (hereinafter, referred to as H), the power source voltage level VDD, and also the 'NETUP2' node maintains 'logic low' (hereinafter, referred to as L), the ground voltage level VSS, so as to disable both a PMOS transistor 30a and an NMOS transistor 30a, and cause the output DQ to maintain high impedance state (hereinafter, referred to as Hi-Z). On this occasion, Hi-Z corresponds to the half of the power source voltage level, namely 'VDD/2' level. During this time, the data control circuits output logic L to both 'NETUP1' and 'NETDN1'.

When the output DQ is desired to be logic H, the data control circuits set logic H and L to 'NETUP1' and 'NETDN1' respectively so as to set logic L to both 'NETUP2' and 'NETDN2'. When the output DQ is desired to be logic L, the data control circuits set logic L and H to 'NETUP1' and 'NETDN1' respectively so as to set logic H to both 'NETUP2' and 'NETDN2'.

On the other hand, as shown in FIG. 2, when data are outputted by a Read command, the first data output D0, starting from Hi-Z, is outputted earlier than the consecutive data outputs D1, D2, and D3. In particular, the fact that the first data output D0 is outputted early with reference to the external clock CLK can result in errors at high speed interfaces.

FIG. 3 is a timing diagram showing the AC timing of the Read operation of a DDR SDRAM employing the related art output buffer circuits.

Referring to FIG. 3, in reality it is difficult for the Read operation of the DDR SDRAM to meet the 'tLZ' specification, the data out impedance time from CLK, in data specifications for a systems company.

As explained above, the fact that the first data output is outputted early in the related art output buffer circuits leads to the difficulty in the satisfaction of the 'tLZ' specification, namely +/−700 ps. To solve this problem, namely to meet the 'tLZ' specification, trying to delay the output of the data output buffer for an arbitrary time toward the positive direction with reference to the external clock CLK leads to another difficulty in the satisfaction of the skew specification 'tAC', the data out access time from CLK, namely +/−700 ps.

SUMMARY OF THE INVENTION

The primary objective of the present invention, to overcome the problem mentioned above, is to provide a data output buffer capable of preventing the phenomenon of a wide data valid window caused from early outputting of the first output data during data output operations.

In order to achieve this objective, the present invention provides a data output buffer circuit in a semiconductor memory device which includes: a driving part for receiving pull-up and pull-down control signals and driving a data output terminal with a voltage level corresponding to data read from a memory cell; and a controlling part for supplying the driving part with control signals to delay the first output of the read data for a designated delay time, and to cause the output of the driving part to retain Hi-Z during the designated delay time.

In addition, in order to achieve this objective the present invention provides a data output buffer circuit in a semiconductor memory device which comprises: a latch part for holding pull-up and pull-down control signals corresponding to data read from a memory cell; a data out driver for amplifying and outputting the output of the latch part; and a controlling part for supplying the latch part with control signals to delay the first output of the read data for a designated delay time, and to cause the output of the data out driver to retain Hi-Z during the designated delay time.

In the related art, the first data output coming early results in an error of the 'tLZ' specification. In the circuit of FIG. 1, this error can be corrected by setting logic H to the NETUP2 node and logic L to the NETDN2 for a designated time upon the output of the first data.

Using this reasoning the present invention generates the data out enable signal by delaying the external Read command, and allows the internal data to be outputted out only when this signal is logic H, and thereby prevents the phenomenon of the wide data valid window of the first data.

BRIEF DESCRIPTION OF THE DRAWINGS

The above objectives and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, preferred embodiments of the present invention will be explained in detail.

Figure 4:
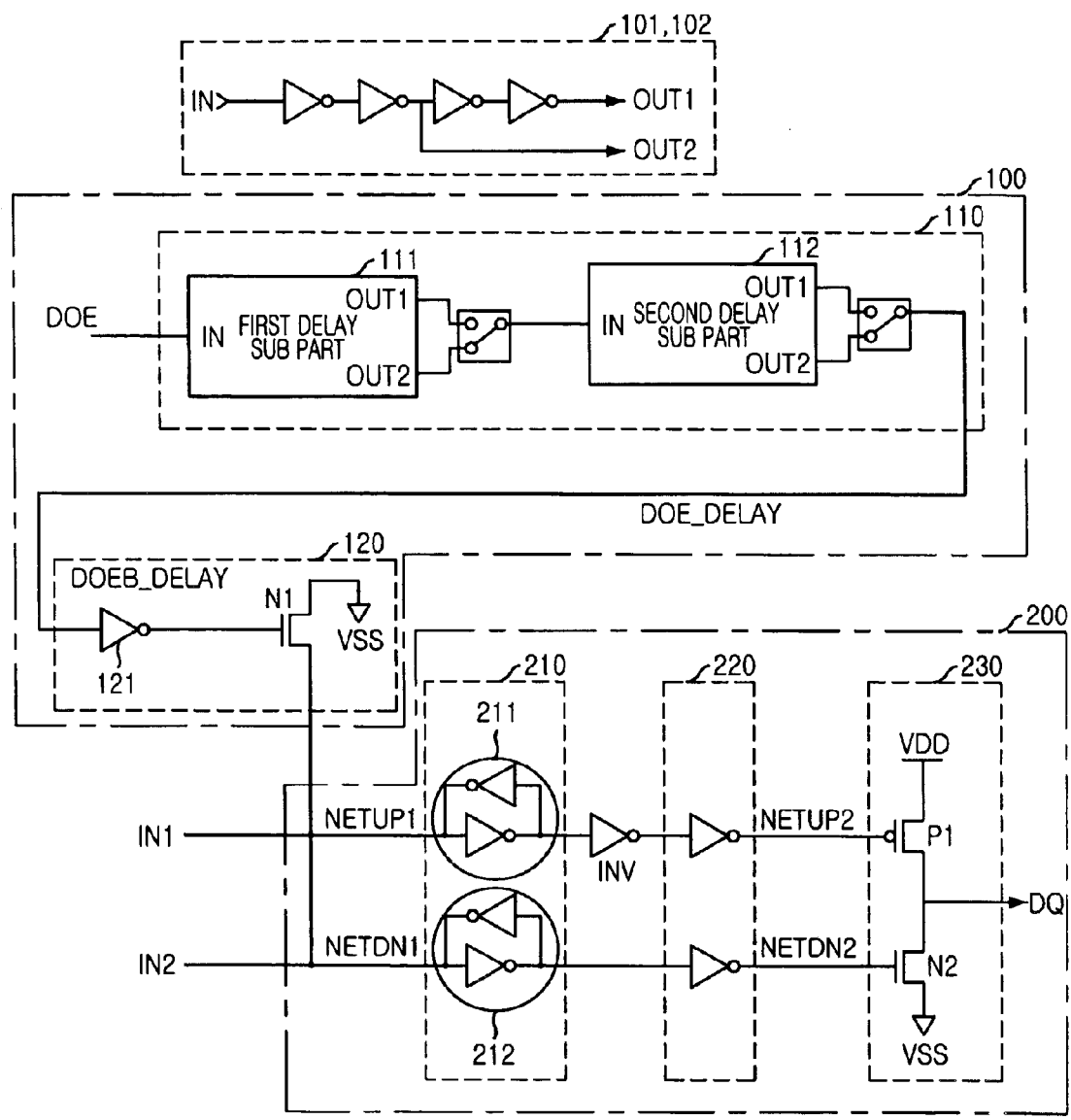
FIG. 4 is a circuit diagram showing a data output buffer capable of adjusting the data window in accordance with an embodiment of the present invention.
Figure 5:
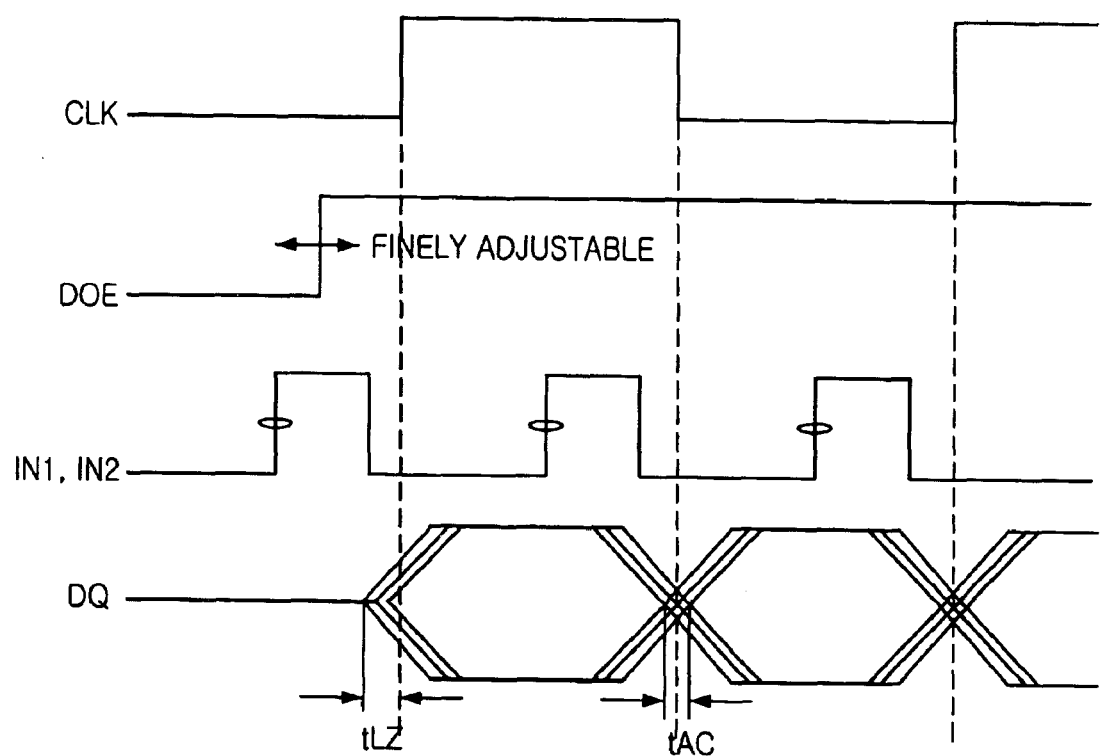
FIG. 5 is a timing diagram showing the AC timing of the Read operation of a DDR SDRAM employing the output buffer circuit of FIG. 4.

FIG. 4 is a circuit diagram showing a data output buffer capable of adjusting the data window in accordance with an embodiment of the present invention. FIG. 5 is a timing diagram showing the AC timing of the Read operation of a DDR SDRAM employing the output buffer circuit of FIG. 4.

To overcome the problem mentioned before by reducing the 'tLZ' time, an embodiment of the present invention includes circuits for maintaining Hi-Z, namely VDD/2 voltage level, of the output of the output buffer.

When semiconductor memory circuits generate Read commands, the data output buffer circuit of the present invention generates a data out enable (hereinafter, DOE) signal using these Read commands. In other words, the DOE signal maintains logic H for the output data burst length upon the Read command, while it maintains logic L before the Read command.

The DOE_DELAY signal and complemented DOEB_DELAY signal thereof, DOE signals delayed by designated time duration, are generated through a delay part having a fine adjustment capability, and determine whether to permit the outputting of internal data of a chip into a latch part.

Referring to FIG. 4, the data output buffer circuit of the present invention includes a driving part 200 and a control part 100. The driving part receives pull-up and pull-down control signals IN1 and IN2, and drives data output terminals with voltage levels corresponding to the read data from memory cells. The control part 100 provides the driving part 200 with the DOE_DELAY control signal, which delays the first output data read from the memory cells by a designated amount of time so as to maintain Hi-Z of the output of the driving part for the delayed time duration.

On this occasion, the two input signals IN1 and IN2 are termed to as pull-up and pull-down control signals respectively. In driving the terminal of the driving part 200, logic H value of the IN1 signal pulls up DQ to logic H; logic L value of the IN2 signal pulls down DQ to logic L; and the simultaneous logic L values of the IN1 and IN2 signals maintain Hi-Z of DQ.

As an example, the pull-up and pull-down control signals IN1 and IN2 can be considered to be signals provided by a data control circuit (not shown) to output the data read from memory cells. This data control circuit is used to provide the data output buffer with the data come via a pipe latch of a semiconductor memory device, and generates the two input signals IN1 and IN2 in accordance with the read data from the memory cells so as to set logic H to DQ in case of logic H of the read data.

Hence, it can be said that in case of a DDR SDRAM this data control circuit includes two differential amplifiers responding to and being synchronized with the rising and falling edges of a clock pulse respectively, and each differential amplifier has two output signals.

The controlling part 100 plays a role to delay the first data output read from memory cells so as to satisfy the 'tLZ' specification, the data out impedance time from CLK, through finely adjusting the DOE signal. The DOE signal maintains logic H during the time when DQ, the output of the driving part 200, is requested to maintain Hi-Z, and maintains logic L during the output time of the read data.

In addition, the controlling part 100 includes a delaying subpart 110 and a switching subpart 120. The delaying subpart 110 generates the DOE_DELAY signal so as to satisfy the 'tLZ' specification by delaying the DOE signal. The switching subpart 120 controls the behavior of DQ by switching the inputs to the input terminals NETUP1 and NETDN1 of the driving part 200. The input terminals of the driving part 200 can take logic values either from the delaying subpart 110 for maintaining Hi-Z of DQ, namely both logic L, in response to the DOE_DELAY signal or from other input signals IN1 and IN2 for letting the value of DQ to change according to signals IN1 and IN2.

The delaying subpart 110 is composed of a chain of inverters, and a delay of two inverters is the minimum unit delay. The delaying subpart 110 includes at least two unit delaying subparts 111 and 112, and controls the amount of delay by changing the number of levels of the unit delaying subpart 111 and 112.

Two serially connected unit delaying subparts 111, 112 have two outputs: a 2-level delayed output 'OUT2' and a 4-level delayed output 'OUT1'. On this occasion, the DOE_DELAY signal is generated by delaying the DOE signal in order to finely adjust the 'tLZ' time, the data out access time from CLK/CLKB, and the delay time of a 2-level inverter is less than or equal to 100 ps in general.

The switching subpart 120 includes: an inverter for generating the output DOEB_DELAY signal by complementing the input DOE_DELAY signal; and a switching transistor N1 taking the DOE_DELAY signal as gate input, one side thereof connected to the ground voltage terminal VSS, and the other side thereof commonly connected to the two input terminals NETUP1 and NETDN1 of the driving part 200. In the present embodiment, for illustration, an NMOS transistor is used for the switching transistor N1.

On the other hand, although the switching transistor N1 is commonly connected to the two input terminals of the driving part 200, more specifically a latch subpart 210, for illustration in FIG. 4, it is possible that the switching transistor Ni takes the DOE_DELAY signal as common gate input, one side thereof is connected to the ground voltage terminal VSS, and the other side thereof is separately connected to the different input terminals of the latch subpart 210.

The driving part 200 includes a latch subpart 210, an inverter INV, a data out pre-driver 220, and a data out driver 230. The latch subpart 210 holds the two input signals IN1 and IN2 from the data control circuits in order to output the read data from memory cells through the data out driver 230. The inverter INV complements one, corresponding to the NETUP1 node, of the two output signals of the latch subpart 210. The data out pre-driver 220 takes as inputs a complemented and a non-complemented output from the latch subpart 210, and drives the data out driver 230. The data out driver 230 amplifies the data transferred through the data out pre-driver 220 and outputs the amplified data.

The latch subpart 210 consists of a first latch subpart 211 and a second latch subpart 212. The first latch subpart 211 between the NETUP1 node and the inverter INV is composed of two inverters cross-coupled together in a manner where the output of one is connected to the input of the other. The second latch subpart 212 between the NETDN1 node and the data out pre-driver 220 is composed of two inverters cross-coupled together in a manner where the output of one is connected to the input of the other.

As mentioned earlier, in the present invention, the DOE_DELAY signal is obtained by delaying the DOE signal generated by external Read commands. The internal data can be externally outputted only when this DOE_DELAY signal is logic H, and thereby the phenomenon of the wide data valid window of the first data output is prevented. On this occasion, it is possible to adjust the amount of delay by changing the number of inverters, namely number of levels, within the unit delaying subpart 101 or 102.

On the other hand, in addition to this change of the number of inverters, the amount of delay can also be adjusted by changing a metal option corresponding to the uppermost layer in semiconductor processes.

Although the latch subpart 210 between the NETUP1 node and the inverter INV is explained here using the two cross-coupled inverters, it can be composed using various combinations including flip-flops.

Hereinafter, the behavior of the output buffer-circuit in accordance with the present invention having the above mentioned structure is explained in detail with reference to FIG. 5.

The delayed DOE signal is outputted as two types of signal: DOE_DELAY and DOEB_DELAY. During the interval when DQ of the data output buffer is requested to maintain Hi-Z, the DOEB_DELAY signal is needed to take logic H; in other words, the DOE_DELAY signal is needed to take logic L.

If the DOE_DELAY signal takes logic H, the DOEB_DELAY signal takes logic L, and the NMOS transistor Ni turns off. This causes NETUP1 and NETDN1 to take the levels of the input signals IN1 and IN2, and so the data output buffer behaves according to the following Table 1.

TABLE 1

| NETUP1 | NETDN1 | NETUP2 | NETDN2 | DQ |
|--------|--------|--------|--------|------|
| H | L | L | L | H |
| L | H | H | H | L |
| L | L | H | L | Hi-Z |
| H | H | L | H | illegal |

If the DOE_DELAY signal takes logic L, the DOEB_DELAY signal takes logic H, and the NMOS transistor N1 turns on. This causes NETUP1 and NETDN1 to take logic L.

If NETUP1 and NETDN1 take logic L, NETUP2 takes logic H, NETDN2 takes logic L, and both P1 and N2 turn on. So, DQ maintains Hi-Z.

As discussed before, it is desirable to maintain this high impedance state of DQ so as to satisfy the 'tLZ' specification. Hence, this high impedance interval of DQ is adjusted by changing the number of levels of the unit delaying subpart 111 and 112, and then by making the DOE_DELAY signal take logic H DQ is outputted in response to the input signals IN1 and IN2.

Hereinafter, the behavior of the output buffer circuit is explained with reference to Table 1.

As mentioned above, after designated amount of delay of the first data output, when the read data from the memory cell is logic H, the pull-up and pull-down control signals IN1 and IN2, inputted to the NETUP1 and NETDN1 nodes from external control circuits, take logic H and logic L respectively. During this time, because both NETUP2 and NETDN2 take logic L, N2 turns off and P1 turns on. So, the VDD level, namely logic H, is outputted through DQ.

When the read data from the memory cell is logic H, the pull-up and pull-down control signals IN1 and IN2, inputted to the NETUP1 and NETDN1 nodes from external control circuits, take logic L and logic H respectively. During this time, because both NETUP2 and NETDN2 take logic H, N2 turns on and P1 turns off. So, the VSS level, namely logic L, is outputted through DQ.

On the other hand, it is necessary to set logic L to both NETUP1 and NETDN1 to maintain Hi-Z of DQ. If both NETUP1 and NETDN1 nodes take logic H, the output of DQ is illegal, i.e. nonexistent.

As a result, by generating the DOE_DELAY signal from the DOE signal through delay, the output time of the first data output can be finely adjusted as indicated by the thick arrow in FIG. 5.

In the present embodiment, as mentioned above, the maintenance of Hi-Z of data needs logic L of the DOE signal, and the outputting of data needs logic H of the DOE signal. The same behavior can be obtained using the opposite logic values if the NMOS transistor Ni in the switching subpart 120 is replaced by a PMOS transistor.

Accordingly, in the data output buffer circuit of the present invention the 'tLZ' specification and the 'tAC' specification, data out access time from CLK/CLKB, can be separately adjusted.

Figure 1:
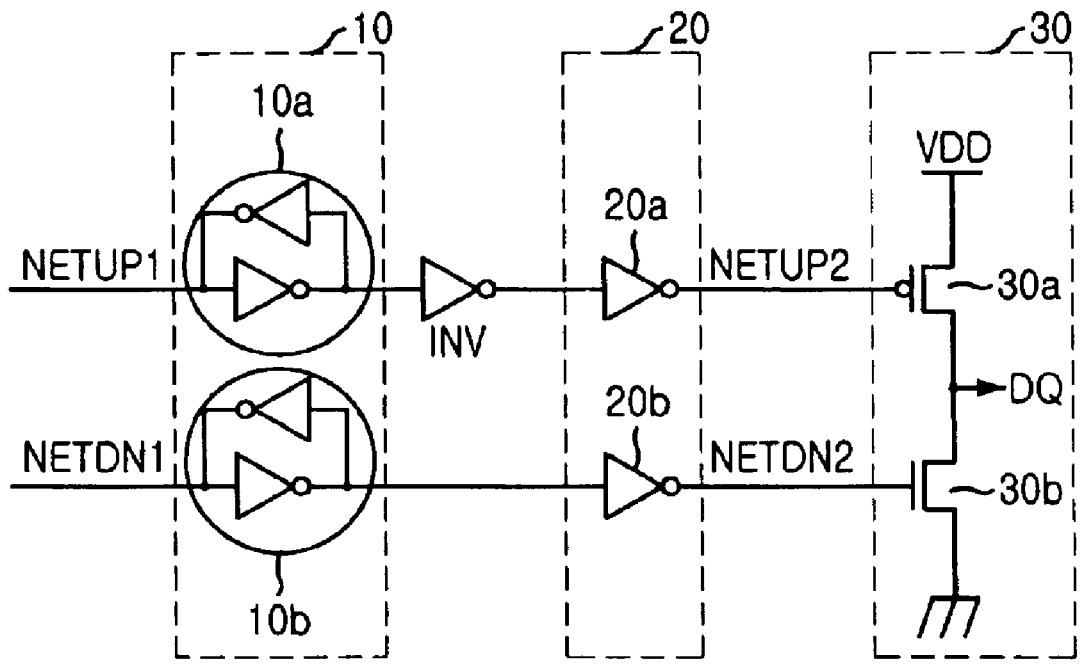
FIG. 1 is a circuit diagram showing a data output buffer circuit according to the related art.
Figure 2:
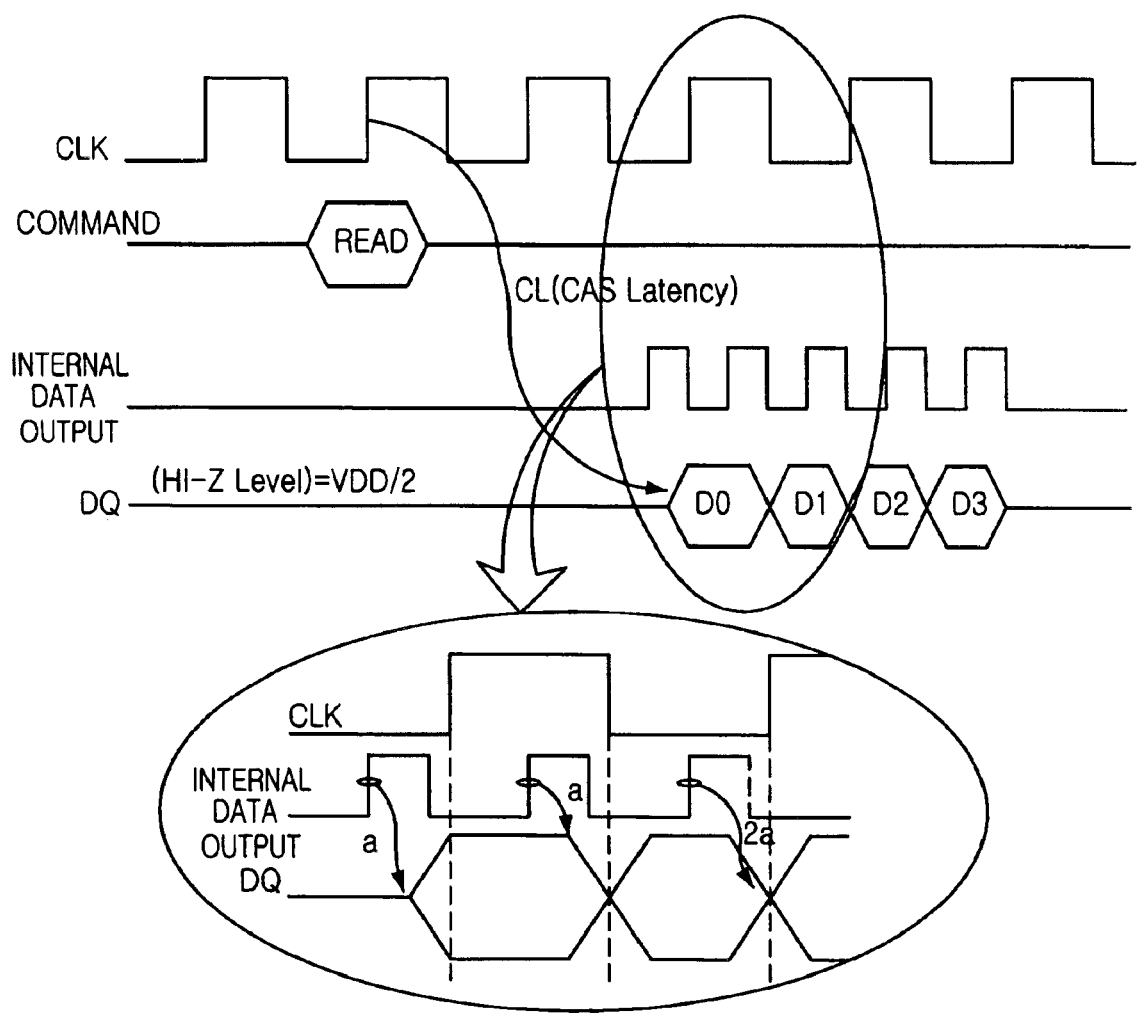
FIG. 2 is a timing diagram that shows data output pulses upon a Read command of a DDR SDRAM employing the output buffer circuit of FIG. 1.
Figure 3:
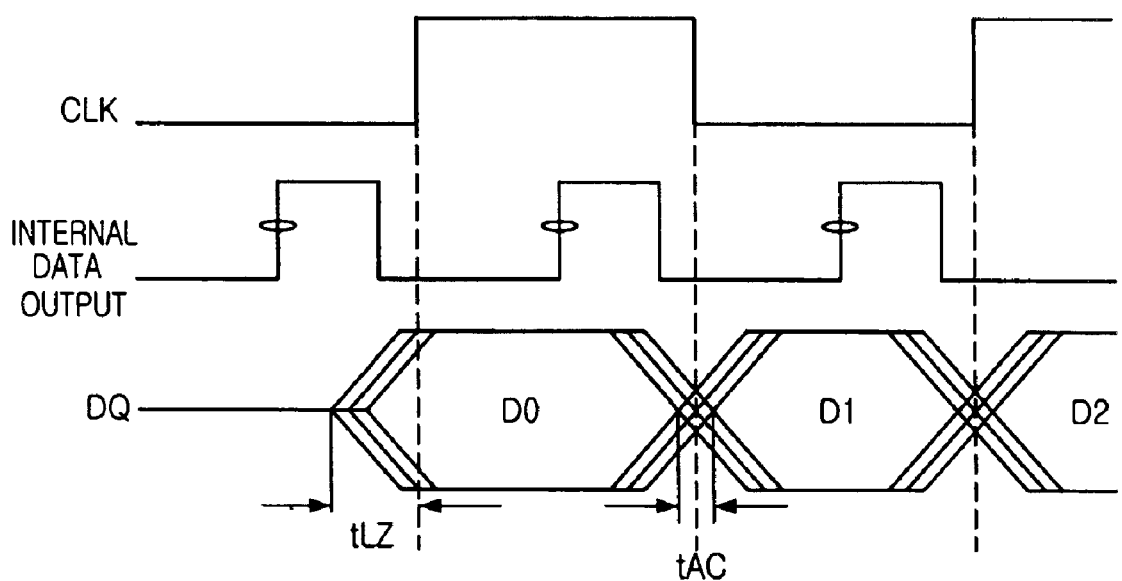
FIG. 3 is a timing diagram showing the AC timing of the Read operation of a DDR SDRAM employing the related art output buffer circuit.

In the related art, referring back to the timing diagram of FIG. 3, if all data outputs are delayed by delaying the internal data output in order to meet the 'tLZ' specification, the 'tLZ' specification of the first data D0 can be met. But, it is difficult to satisfy the consecutive 'tAC' specification owing to the + directional skew from the reference clock CLK.

The present invention, however, as shown in FIG. 5, can not only meet the 'tAC' specification, difficult to be satisfied in high speed interfaces like DDR SDRAM, but also finely adjust the 'tLZ' specification.

In addition, a typical DRAM module consists of 8 to 16 DRAM chips, and narrowing or widening the window of output pulse in a DRAM chip can negatively affect operations of the other chips. So, the fine adjustments of the data valid window contribute to the enhancement of normal operations of a DRAM module.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Accordingly, as explained above the present invention makes it possible not only to satisfy the data access time, the 'tAC' specification, but also to finely adjust the data output time from a reference clock, 'tLZ'. Consequently, the present invention can greatly enhance the performance of the data output buffer circuit.

What is claimed is:

1. A data output buffer circuit in a semiconductor memory device, comprising:
   driving means for receiving pull-up and pull-down control signals and driving a data output terminal with voltage levels corresponding to data read from a memory cell; and controlling means for supplying the driving means with control signals to delay the first output of the read data for a designated delay time, and to cause the output of the driving means to retain high impedance state during the designated delay time.

2. The data output buffer circuit as recited in claim 1, wherein the controlling means delays the first output of the read data so as to meet the 'tLZ' specification, the data output time from an external reference clock.

3. The data output buffer circuit as recited in claim 2, wherein the control signal is generated by delaying a data out enable signal.

4. The data output buffer circuit as recited in claim 3, wherein the data out enable signal maintains a first logic value before a data read command is activated, and maintains a second logic value as much as burst length of the output data while the data read command is activated.

5. The data output buffer circuit as recited in claim 4, wherein the data out enable signal maintains the first logic value while the output of the driving means needs the maintenance of high impedance state, and maintains the second logic value while the read dada is being outputted.

6. The data output buffer circuit as recited in claim 3, wherein the controlling means comprises:
a delaying part for generating the control signal by delaying the data out enable signal; and
a switching part for causing the two input terminals of the driving means to take either designated logic values setting high impedance state to the output in response to the control signal or the logic values of the pull-up and pull-down control signals.

7. The data output buffer circuit as recited in claim 6, wherein the delaying part includes at least 2 levels of a unit delaying part having an inverter chain structure.

8. The data output buffer circuit as recited in claim 7, wherein the controlling means adjusts the amount of delay by changing the number of levels of the unit delaying part.

9. The data output buffer circuit as recited in claim 6, wherein the switching part comprises:
a first inverter for complementing the control signal; and
a switching transistor taking the signal as gate input, one side thereof connected to the ground voltage terminal, the other side thereof commonly connected to the two input terminals of the driving means.

10. A data output buffer circuit in a semiconductor memory device, comprising:
a latch means for holding pull-up and pull-down control signals corresponding to data read from a memory cell;
a data out driver for amplifying and outputting the output of the latch means; and
a controlling means for supplying the latch means with control signals to delay the first output of the read data for a designated delay time, and to cause the output of the data out driver to retain high impedance state during the designated delay time.

11. The data output buffer circuit as recited in claim 10, wherein the controlling means delays the first output of the read data so as to meet the 'tLZ' specification, the data output time from an external reference clock.

12. The data output buffer circuit as recited in claim 11, wherein the control signal is generated by delaying a data out enable signal.

13. The data output buffer circuit as recited in claim 12, wherein the data out enable signal maintains a first logic value before a data read command, and maintains a second logic value as much as burst length of output data upon the data read command.

14. The data output buffer circuit as recited in claim 13, wherein the data out enable signal maintains the first logic value while the output of the data out driver needs the maintenance of high impedance state, and maintains the second logic value while the read dada is being outputted.

15. The data output buffer circuit as recited in claim 12, wherein the controlling means comprises:
a delaying part for generating the control signal by delaying the data out enable signal; and
a switching part for causing the two input terminals of the latch means to take either designated logic values setting high impedance state to the output in response to the control signal or the logic values of the pull-up and pull-down control signals.

16. The data output buffer circuit as recited in claim 15, wherein the delaying part comprises at least 2 levels of a unit delaying part having an inverter chain structure.

17. The data output buffer circuit as recited in claim 16, wherein the controlling means adjusts the amount of delay by changing the number of levels of the unit delaying part.

18. The data output buffer circuit as recited in claim 15, wherein the switching part comprises:
a first inverter for complementing the control signal; and
a switching transistor taking the signal as gate input, one side thereof connected to the ground voltage terminal, the other side thereof commonly connected to the two input terminals of the latch means.

19. The data output buffer circuit as recited in claim 10, further comprising:
a second inverter for complementing one of the two output signals of the latch means; and
a data out pre-driver taking as inputs both a complemented and non-complemented outputs from the latch means, and for driving the data out driver.

20. The data output buffer circuit as recited in claim 19, wherein the latch means comprises:
a first latch part, between one of the two input terminals and the second inverter, composed of two inverters cross-coupled together in a manner where the output of one is connected to the input of the other; and
a second latch part, between the other one of the two input terminals and the data out pre-driver, composed of two inverters cross-coupled together in a manner where the output of one is connected to the input of the other.

* * * * *